United States Patent [19]
Fairbanks

[11] Patent Number: 6,069,514
[45] Date of Patent: May 30, 2000

[54] USING ASYNCHRONOUS FIFO CONTROL RINGS FOR SYNCHRONOUS SYSTEMS

[75] Inventor: Scott M. Fairbanks, Mountain View, Calif.

[73] Assignee: Sun Microsystems, Inc., Palo Alto, Calif.

[21] Appl. No.: 09/065,643

[22] Filed: Apr. 23, 1998

[51] Int. Cl.[7] ..................................... H03K 1/04
[52] U.S. Cl. ................. 327/292; 327/153; 327/161; 327/295; 327/297; 365/219; 365/221; 365/233
[58] Field of Search ..................... 365/219, 221, 365/233; 327/144, 153, 161, 292, 295, 297

[56] References Cited

U.S. PATENT DOCUMENTS 5,444,407  8/1995  Ganapathy et al. .................. 327/295
5,656,963  8/1997  Masleid et al. ...................... 327/297
5,691,662  11/1997 Soboleski et al. .................. 327/292

Primary Examiner—Margaret R. Wambach
Attorney, Agent, or Firm—James P. Cleary; Townsend and Townsend and Crew LLP

[57] ABSTRACT

A system for distributing clock signals to multiple locations on a chip with minimal skew is disclosed. A series of FIFO control structures, connected in a ring by signal lines of substantially equal length, generates multiple clock signals of equal phase and frequency. The oscillation frequency of the FIFO control ring may be increased to accommodate higher-speed chips, while maintaining synchronization of clock pulses at each stage of the FIFO control ring.

10 Claims, 12 Drawing Sheets

USING ASYNCHRONOUS FIFO CONTROL RINGS FOR SYNCHRONOUS SYSTEMS

BACKGROUND OF THE INVENTION

The present invention relates generally to integrated circuit ("IC") devices, or chips, and more specifically to a system for distributing synchronous clock signals on a chip using asynchronous FIFO memory circuits.

ICs are built from single chips of semiconductor material. A single IC chip contains a number of electrical components, such as diodes, transistors and resistors, built into the semiconductor material. Today, Very Large-Scale Integrated (VLSI) circuit chips contain hundreds of thousands of transistors and other components arranged in arrays and built directly onto the chip.

Interconnected chip components usually operate under a synchronization system in order to function properly. For example, a simple serial bank of flip-flop memory registers successively accesses and transfers data elements according to a predetermined clock cycle. Every cycle of the clock signal, each register turns on and performs a function, such as accessing information from a data source, storing the data, or transferring the data to the next register. Flip-flop memory circuits are just one example of interconnected components that operate under a synchronized environment according to a common clock signal.

Synchronized components on a chip are traditionally clocked from a single clock source. A clock device, normally a separate oscillator chip or circuit, distributes a clock signal to components on the chip from a single clock source, and the signal from that clock source is distributed to various locations around the chip by a system of signal lines. Buffers or repeaters may be added depending on the number of locations to be clocked or their relative distances from the clock source.

A major problem affecting the synchronization of multiple components is clock skew. Skew is a relative timing deviation, either in phase or in frequency, between a given clock signal and a reference signal. The reference signal is often the clock source. One cause of clock skew is the varying distances between components to be clocked and the clock source. Signal delay, a function of electrical path length, causes the clock signal to arrive at components near the clock source earlier than at more distant components. Clock skew can be avoided by placing all clocked components the same distance from the clock source, but such placement is rarely possible given the constraints of chip layout and circuit design. Clock signal buffers and repeaters, which require their own power source and control circuitry, also add delay to the distributed clock signal. Further, because buffers and repeaters have inherent performance variances, it is infeasible to employ them in an a scheme to equalize clock signal timing.

The trend is toward building larger VLSI semiconductor chips with many times more components, all of which are being operated under increasingly faster computing speeds. At faster computing speeds, clock signal frequency increases, resulting in less time between successive clock cycles. With less time between clock cycles, any clock skew would represent a greater portion of a clock cycle. Therefore, what is needed is a more precise clock system which can minimize skew to avoid disruptions in synchronized chip operations.

SUMMARY OF THE INVENTION

The present invention is directed to distribution of a number of precisely synchronized clock signals at each of a plurality of locations on a chip. In one embodiment of the clock signal distribution system according to the present invention, a ring of control structures distributes clock signals to a number of locations on a chip with the effect of each location having a substantially identically timed clock signal source, although the clock signals at different locations might vary by a fixed, predetermined phase shift. Each control structure in the ring is associated with a previous control structure, which in turn is associated with its predecessor, and so on. Similarly, each control structure is associated with a next control structure. The signal delay between successive structures is substantially equal or is adjusted at the control structure to be so. The clock signal is input into one structure as it is output from the previous structure, thus oscillating the signal through the ring. A clock distribution node at each control structure outputs a local clock signal of substantially equal phase and frequency relative to the other local clock signals, with minimal skew.

According to a further aspect of the invention, the clock signals are distributed to a number of locations on a chip by a ring of asynchronous First-In, First-Out (FIFO) control circuits. The FIFO control circuits are asynchronous in that each FIFO control circuit is not clocked. Even though the FIFO control circuits are not clocked, the ring will oscillate the clock signal according to an initialization method which produces a synchronized output clock signal from each FIFO control circuit.

In a first embodiment of a clock distribution system according to the present invention, each FIFO control structure is a pseudo-dynamic asynchronous symmetric protocol (ASP) control circuit. The configuration of the FIFO control circuit alternates from one stage to the next, and the configuration pattern is repeated in equivalent, repetitive blocks.

In a second embodiment of a clock distribution system according to the present invention, each FIFO control structure is a static ASP circuit.

In a third configuration of a clock distribution system according to the present invention, the control structures comprising the ring are micropipeline control circuits. The micropipeline circuitry may be implemented as either a single rail, or as a double rail where each signal has a true and complement version 180 degrees out of phase. The stages have identical signals at corresponding nodes within each stage.

According to a further aspect of the invention, in a ring of control structures, each control structure is associated with a previous control structure in the ring and a next control structure in the ring. Whenever a clock output node produces a clock signal, a data transfer event occurs among control structures associated with that clock output node. A data transfer transitions a FIFO circuit's data register from high to low or low to high. Further, by phase-shifting or delaying the transition outputs, it is possible to have multiples of clock outputs in-phase.

The clock distribution system according to the present invention produces synchronous clock signals with a unique configuration of asynchronous FIFO control circuits. Because each stage is interdependent on both the stage immediately preceding and immediately following, clock signals transition through the ring in highly precise timing sequences. The result is a synchronized clock distribution technique that is far less prone to clock skew than traditional clock distribution systems.

A further understanding of the nature and advantages of the invention may be realized by reference to the remaining portions of the specification and the drawings.

BRIEF DESCRIPTION OF THE DRAWINGS

FIG. 5b is a schematic diagram of an asynchronous FIFO control ring with stages made up of micropipeline FIFO control stages such as those shown in FIG. 5a.

FIG. 6b is a schematic diagram of an asynchronous FIFO control ring with stages made up of micropipeline FIFO control stages such as those shown in FIG. 6a.

DESCRIPTION OF THE PREFERRED EMBODIMENT

Figure 1:
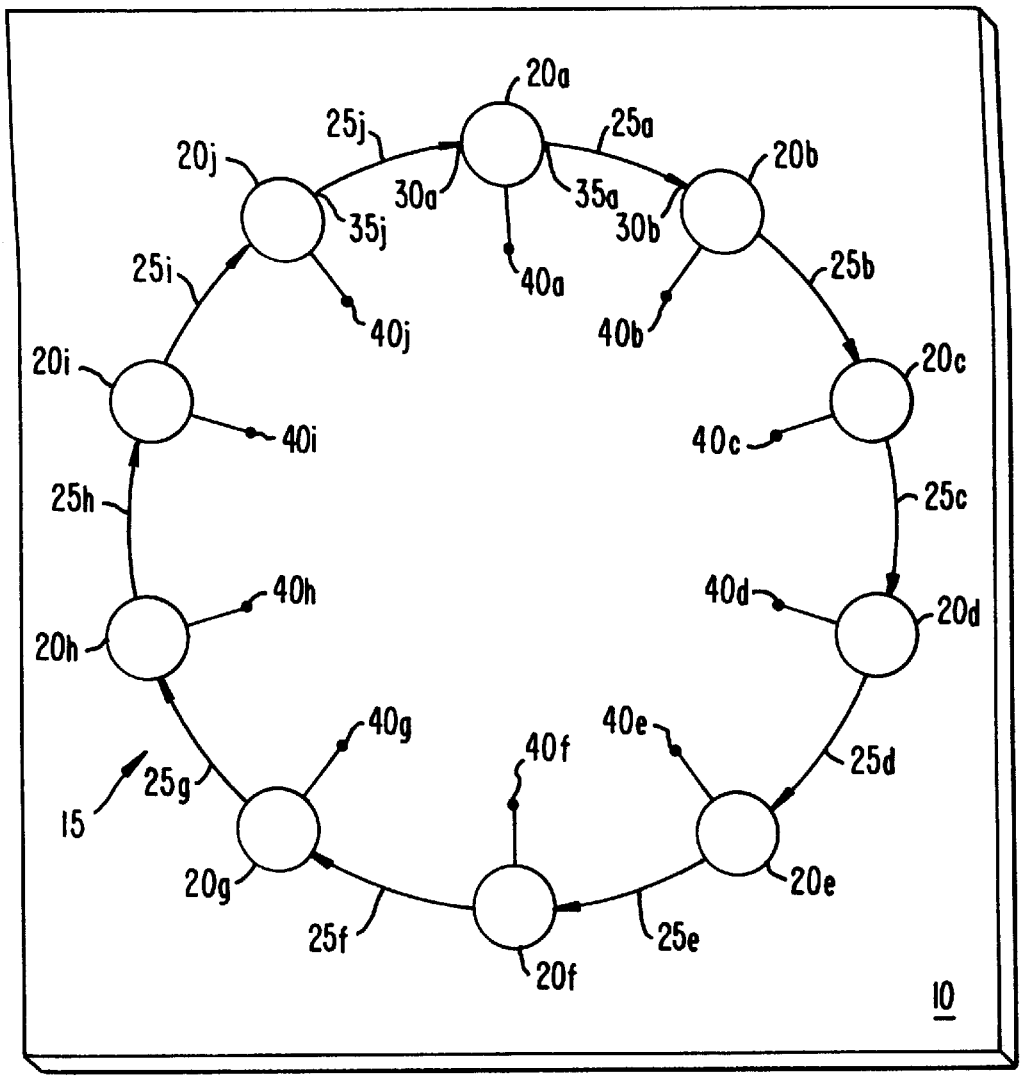
FIG. 1 is a high-level schematic diagram of a system for distributing clock signals on a chip.

FIG. 1 is a high-level schematic diagram of a system 1 for distributing clock signals on a chip 10. In a preferred embodiment, chip 10 is a VLSI circuit chip containing a large number of processor circuits requiring synchronization. However, clock distribution system 1 can be used to distribute clock signals on any IC chip where one or more electrical components operate under substantially identical clock cycles. A ring 15 of control structures 20a–j is built into the semiconductor material of chip 10. The manufacture of IC chips with built-in circuit devices is well-known in the art, and will not be further discussed here.

Each control structure 20 in ring 15 has an input 30 and an output 35. The input of any one control structure 20 and the output of its immediate preceding control structure 20 are coupled by a signal lines 25. In the embodiment shown, signal lines 25a–j are substantially equal in length and connect control structures 20a–j serially into a ring. Ring 15 is shown as having the shape of a circle in FIG. 1, but it should be realized that ring 15 can take any form or shape as long as its control structures 20 are connected in series by signal lines 25. Furthermore, the number of control structures 20 shown in FIG. 1 is for purposes of example only. In the clock distribution system of the present invention, there can be any number of control structures 20 built around chip 10.

Control structures 20 are strategically placed in a number of locations around chip 10. Each control structure 20 is associated with an immediate predecessor control structure and a next immediate control structure. For example, control structure 20a is associated with its predecessor control structure 20j and its next control structure 20b. In this configuration, at any moment in time the present state of each control structure 20 depends on the present state of all other control structures 20. In the example, the output 35j of control structure 20j feeds the input 30a of control structure 20a, the output 35a of which feeds the input 30b of control structure 20b, etc.

Ring 15 will oscillate when data elements propagate through it. Data elements are high and low control signals which, when captured into a particular control structure 20, causes a transition from one state to another. Control structures 20a–j occupy one of only two states: full or empty. Whether a control structure 20 is full or empty depends on both its present state and the present states of adjacent control structures. A full control structure cannot transition; an empty control structure will. Each control structure 20 transitions by capturing a new data value which, in relative terms, is relatively opposite to the data value it currently stores. A transition is a relative internal change from low to high or high to low, depending on the control circuitry employed in each control structure. A control structure 20a captures a new data value whenever its successor control structure 20b has accepted the present value and its predecessor control structure 20j has the new data value ready. In other words, a full control structure's output signal will not cause its successor to transition, nor will the output of its predecessor cause it to transition. Thus, oscillation of ring 15 also depends on how the ring is initialized, i.e.: all control structures cannot be initially coded so that ring 15 is completely full. There must be empty control structures for data elements to move into for oscillation to occur.

In the present example shown in FIG. 1, control structure 20j is initialized full, control structure 20a is initialized empty, and control structure 20b is initialized full, repeating the initial pattern. Control structure 20a, being empty, changes its state to full as it latches the data element from control structure 20j. Control structure 20j, in turn, changes its state to empty as it outputs its data element to the input 35a of control structure 20a, and then looks to its immediate predecessor for its next data element input. Control structure 20b also changes its state to empty as it outputs its data element to the next control structure 20 in the ring 15, and looks to the output 30a of control structure 20a for its next data element input. In this manner, control structures 20a–j oscillate between full and empty states. Each time any one control structure 20 changes its state, a clock signal is output at clock distribution node 40. Clock distribution nodes 40 can output a local clock signal of substantially equal phase and frequency as other nodes in ring 15 depending on how ring 15 is initialized, the control circuitry employed in control structures 20a–j and any signal delay of signal lines 25.

Figure 2:
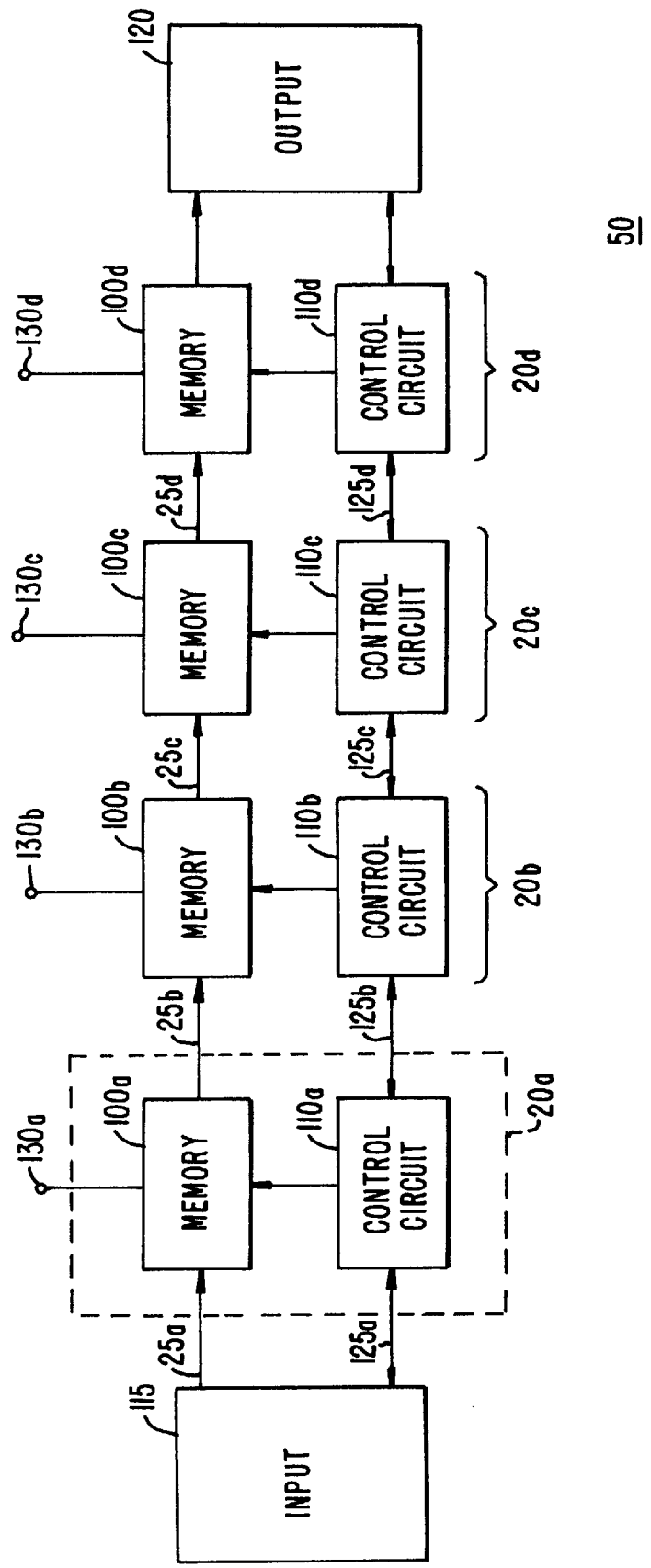
FIG. 2 is a block diagram of a FIFO control circuit.

FIG. 2. is a block diagram of a First-In, First-Out ("FIFO") circuit 50 to aid in understanding of the control structures 20 shown in the general structure of ring 15 in FIG. 1. FIFO circuit 50 includes an input 115, an output 120 and a series of control structures 20, which further comprise data registers 100 and control circuits 110. Data registers 100a–d store and move data through FIFO circuit 50 in one direction, as illustrated by the direction of the arrows on data lines 25a–d. Coupled to each data register is a control circuit 110a–d, to control the state of each associated data register 100a–d, respectively. Each set of one data register 100 and one control circuit 110 makes up a control structure 20.

A FIFO circuit is so named because data put into an input of the FIFO circuit is output in the same order it is received. Data elements thus propagate in one direction. FIFO circuits are made up of stages. As described above, a stage can either be "full" (unable to transition), or "empty" (set to transition). Each transition incrementally propagates a data element to a successive stage. The concepts of full and empty and their importance in FIFO circuit operation are more fully explained in the description below.

The FIFO circuit 50 of FIG. 2 is shown having four FIFO stages 20a–d. In each FIFO stage 20, control circuits 110a–d monitor memories 100a–d, and set the memories' state as being "empty" and ready to receive data, or "full" and ready to transfer out data, depending on the memories' present state. The logic for moving data along FIFO circuit 50 from one stage to another is: 1) transfer data from a full stage to the next empty stage, 2) set the empty control stage's state to full, and 3) set the full control stage's state to empty. To function properly, somewhere along the FIFO circuit 50 a full stage must precede an empty stage, so that the data element in the full stage can transition out and nearly simultaneously enter the empty stage.

In general, FIFO circuits may either be clocked (synchronous) or non-clocked (asynchronous). A clocked FIFO memory has a clock circuit distributed to each of its separate circuits, and each operates in lock-step according to clock cycles received from an external circuit or source. An asynchronous FIFO circuit is not clocked. Rather, a data transfer operation is a localized communication between successive stages. Each stage operates at its own pace using control information from adjacent stages. By being free of waiting for a clock pulse to transfer data and reset the stage, the data transfer speed of an asynchronous FIFO circuit is basically limited by two factors: the transfer speed of the individual circuits, and the particular state of all stages in a circuit at any particular moment in time.

Data in an asynchronous FIFO memory moves through empty stages until it is stopped by a full stage. A full stage will not transition to empty until the next stage ahead of it is empty. Thus, the data transfer speed of each individual FIFO stage 20 is dependent on the time required for the individual registers and their control elements to sense the present state of each register as being either full or empty, and then move the data accordingly. The value of the data is of little importance. The key is in a stage's transition from one state to another, i.e.: from low to high or from high to low. When a stage cannot transition because of the state of adjacent stages, it is full. Likewise, a stage that is prepared to accept a present value of its predecessor is empty.

When input 115 has a data element ready to be transferred into memory 100a, input 115 checks the status of control circuit 110a. If control circuit 110a indicates memory 100a is empty, input 115 transfers the data element to memory 100a and control circuit 110a changes its state to indicate that memory 100a is now full. Control circuit 110a next checks for the state of memory 100b by communicating with control circuit 110b. If memory 100b is full, control circuit 110b will indicate to control circuit 110a that memory 100b cannot receive the data element currently stored in memory 100a. When memory 100b is empty, control circuit 110b indicates to control circuit 100a that memory 110b is ready to receive a next data element from memory 100a. Control circuit 110b will change its state again to indicate that memory 100b has transferred the data element it momentarily stored, and is currently in empty state.

Figure 3:
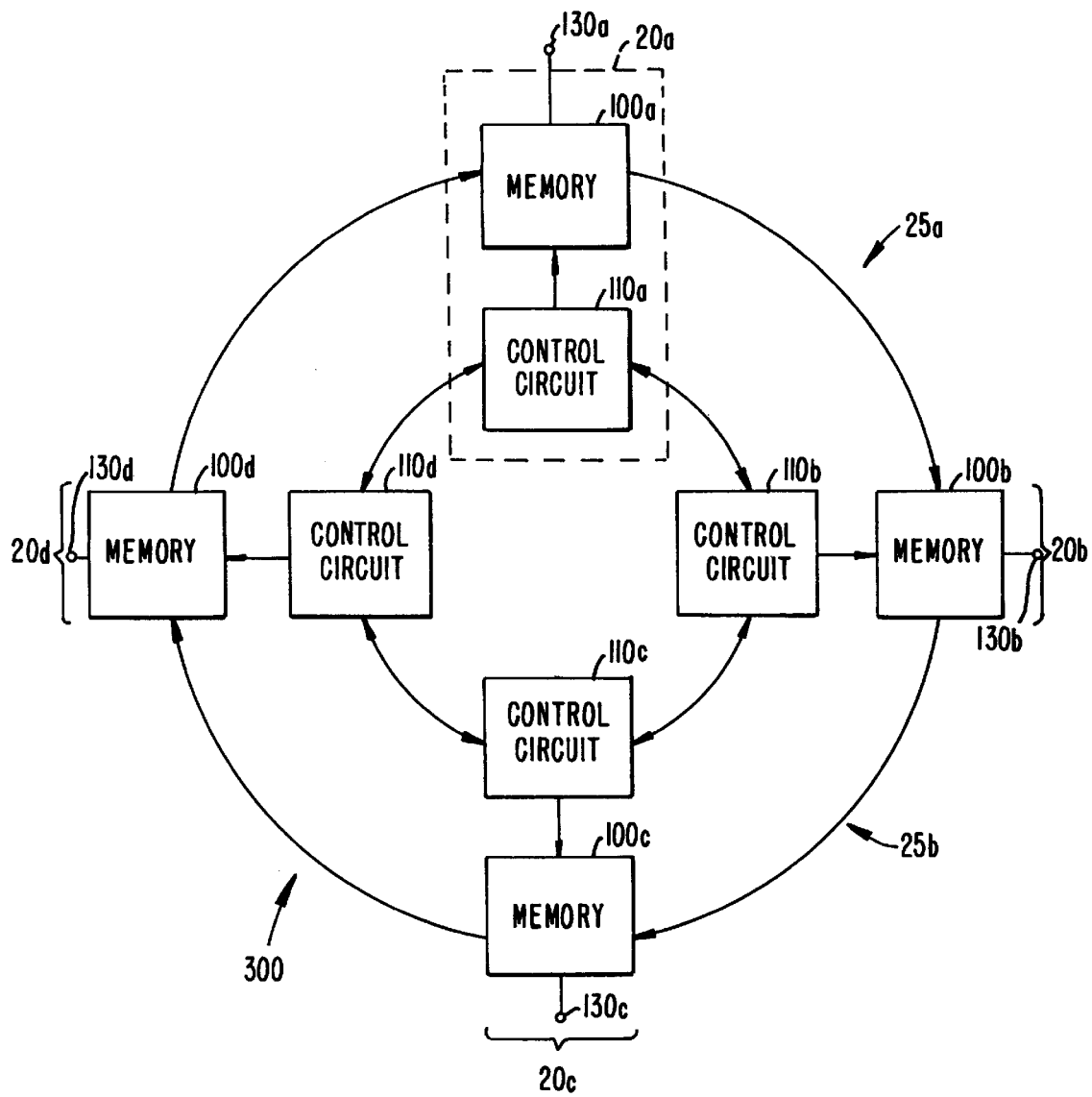
FIG. 3 is a block diagram of an asynchronous FIFO control ring.

FIG. 3 is a block diagram of FIFO control circuit 50 (shown in FIG. 2) formed into a FIFO control ring 300, according to the present invention. In control ring 300, input 115 and output 120 (see FIG. 2) are removed and the stages 20 are connected in a ring 300. Each stage 20 in FIFO control ring 300 has a clock output 130. Clock outputs 130a–d are shown in FIG. 3 as being coupled to memories 100a–d, respectively. This is simply to illustrate that a clock signal may be fed to an output from any point in the FIFO control ring 300 where a data element transition occurs. The clock output 130 outputs a signal when the structure to which it is attached makes a transition from empty to full.

FIFO control ring 300 operates substantially the same as the ring 10 of control stages 20 illustrated in FIG. 1. Data elements move from one data register to the next as long as the next immediate data register in the ring is empty. Not shown in FIG. 3 is a circuit for initializing data registers 100 so that the ring circuitry 300 can oscillate, or transition data elements around FIFO control ring 300. For transitioning to occur, all of the control structures 20 in FIG. 3 should neither be initialized completely full nor completely empty, so that at some point in the FIFO control ring 300, adjacent stages can transition their respective states.

Figure 4A:
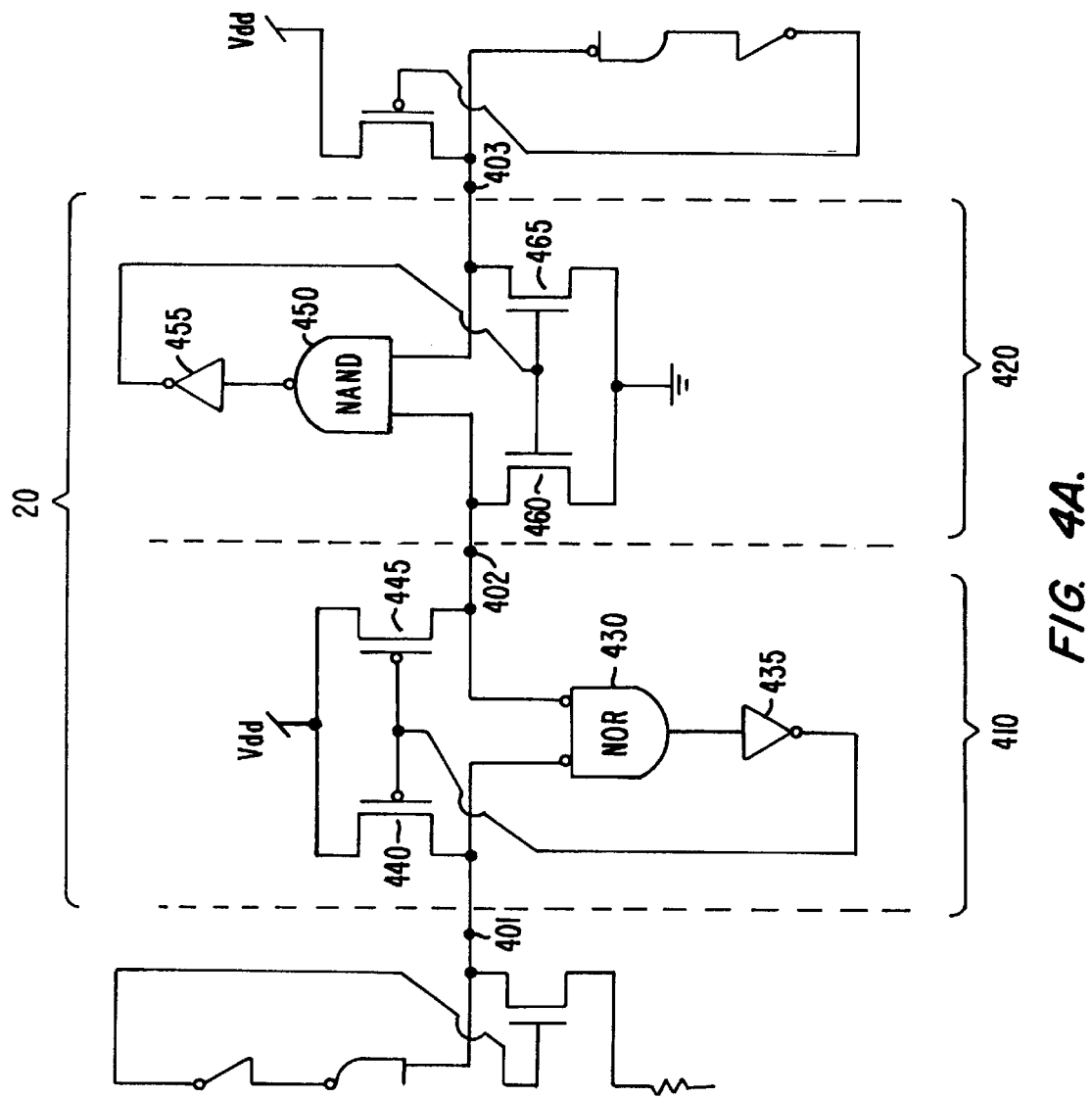
FIG. 4a is a schematic diagram of a pseudo-dynamic ASP FIFO control stage.

FIG. 4a is a schematic diagram of a pseudo-dynamic ASP FIFO control stage 21 in a first embodiment of the present invention. FIFO circuits use combinational circuitry. They rely on sequential logic circuits having a memory characteristic where the circuit's output is dependent not only on the current input conditions but also on the current output state of the circuit. The primary building block in combinational circuits is the logic gate. Complimentary metal oxide semiconductor (CMOS) technology is one example of an IC switching logic used in modern FIFO digital systems.

In the embodiment shown in FIG. 4a, control stage 21 contains two asynchronous pseudo-dynamic ASP FIFO control circuits 410 and 420. Control circuit 410 is shown with NOR gate 430, inverter 435, and PMOS transistors 440 and 445. The source nodes of transistors 440 and 445 are connected to a power supply Vdd. The drain node of PMOS transistor 440 is connected to one input of NOR gate 430 as well as the output 401 of a previous control structure 21. The drain node of PMOS transistor 445 is connected to a second input of the NOR gate 430 as well as the input to control circuit 420. The gates of PMOS transistors 440 and 445 are connected to the output of inverter 435.

Control circuit 420 is shown with NAND gate 450 and inverter 455. Transistors 460 and 465 are NMOS transistors, and their drain nodes are connected to a common ground node. The source node of NMOS transistor 460 is connected a first input to NAND gate 450 as well as to the drain node of PMOS transistor 445, or node 402. The source node of NMOS transistor 465 is connected to a second input to NAND gate 450 as well an input 403 of a next control stage 21. The gates of NMOS transistors 460 and 465 are coupled to the output of inverter 455.

In order for control stage 21 shown in FIG. 4a to oscillate, or transition from one state to another, circuits 410 and 420 of control stage 21 must be initialized so that they transition individually. Node 401 corresponds to the output of a previous stage. Node 403 corresponds to the output of control stage 21. Nodes 401, 402 and 403 must have an initial state so that circuits 410 and 420 are neither both full nor both empty, a condition which will not allow transitioning.

To illustrate, nodes 401, 402 and 403 are initialized at the same voltage level. This corresponds to a Full/Empty pattern in adjacent circuits 410 and 420 in control stage 21 because they are encoded to have opposite states. Since the signal at the inputs of NOR gate 430 are both high, the output of inverter 435 will be high, causing a high signal to be applied to the gates of PMOS transistors 440 and 445, placing them in an "off" state. Likewise, since the signals at the inputs of NAND gate 450 are both high, the output of inverter 455 will be high, causing a high signal to be applied to the gates of the NMOS transistors, placing them in an "on" state. Now nodes 401, 402 and 403 exhibit the respective states of Full, Empty, and Full. Thus, the Full condition at node 402 has moved to node 403, leaving node 402 in an Empty state. The logic high or low signals associated with the Full or Empty states will continue to propagate through each control structure only if, and to the extent which Empty nodes are available to hold them.

Figure 4B:
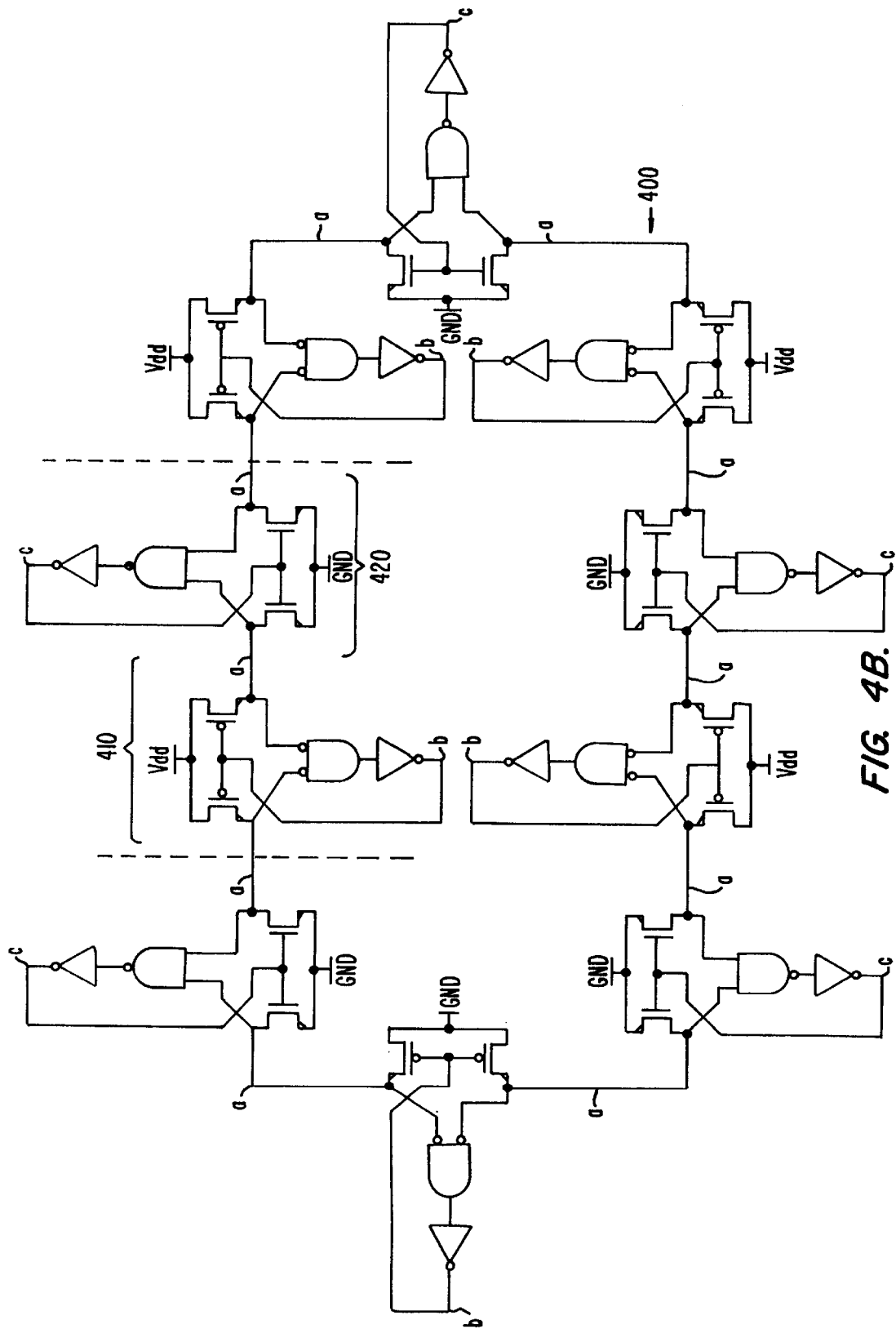
FIG. 4b is a schematic diagram of a ring of pseudo-dynamic ASP FIFO control circuits.

FIG. 4b is a circuit diagram of clock distribution ring 400 using the asynchronous FIFO control structures discussed from FIG. 4a. In the embodiment shown in FIG. 4b, FIFO control stage 22 from FIG. 4a is repeated five times, alternating between the FIFO control circuit 410 and FIFO control circuit 420, described above. The FIFO control ring having five stages is shown for purposes of example only. It should be understood that a ring may be formed by serially connecting any number of stages 22 depending on the size of the chip and the desired number of clock output nodes.

Each pair of control circuits 410 and 420 form a stage 22, also described above. Each control stage 22 exhibits a phase delay of the same magnitude of a clock signal oscillating around FIFO ring 400. For example, when control ring 400 is initialized half full, all nodes labelled the same are in-phase. Nodes labelled "a" are 120 out of phase with nodes labelled "b" and "c" which in turn are also 120 degrees out of phase. Thus, a clock distribution node may be tapped off from any like-labelled node for a synchronous clock output. The asynchronous FIFO control ring 400 can be built to generate any number of phases, depending on how it is initialized.

Figure 4C:
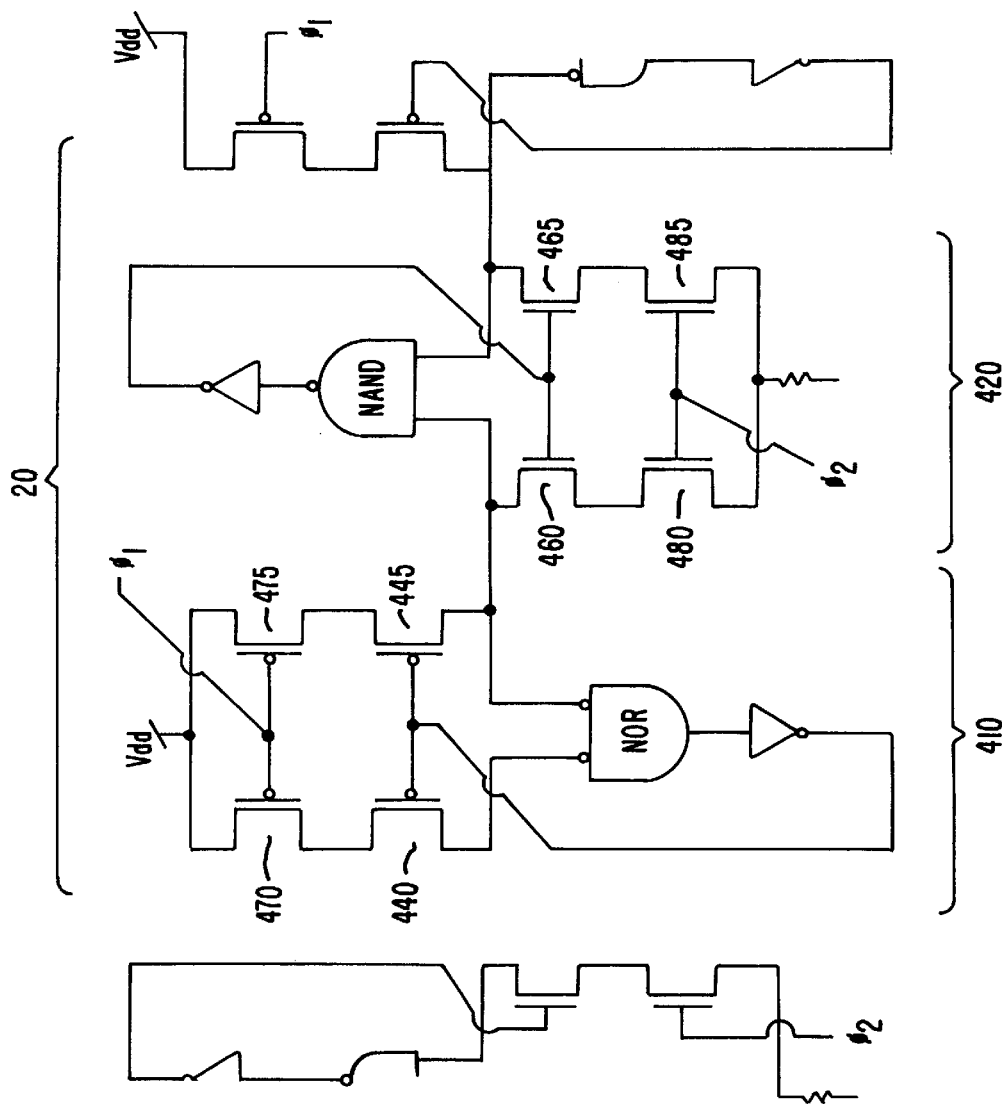
FIG. 4c is a schematic diagram of a pseudo-dynamic ASP FIFO control stage with series transistors added to control frequency.

FIG. 4c shows an alternative embodiment of a control stage according to the present invention. Control circuits 410 and 420, similar to those shown in FIG. 4a, make up control stage 23. In this alternative embodiment, control circuit 410 has PMOS transistors 470 and 475 connected in series with PMOS transistors 440 and 445, respectively. Likewise, control circuit 420 has NMOS transistors 480 and 485 connected in series with NMOS transistors 460 and 465, respectively.

The additional series transistors to the control structures 410 and 420 allow the frequency of FIFO control stage 23 to be controlled. For example, to match the frequency of a clock distribution ring to an off-chip oscillator, the gates of the additional series transistors may be connected to an analog input. The analog voltage may be adjusted to limit the current passing through these transistors and therefore limit the frequency at which the FIFO control ring, made of stages 23 from FIG. 4b, can oscillate.

Figure 4D:
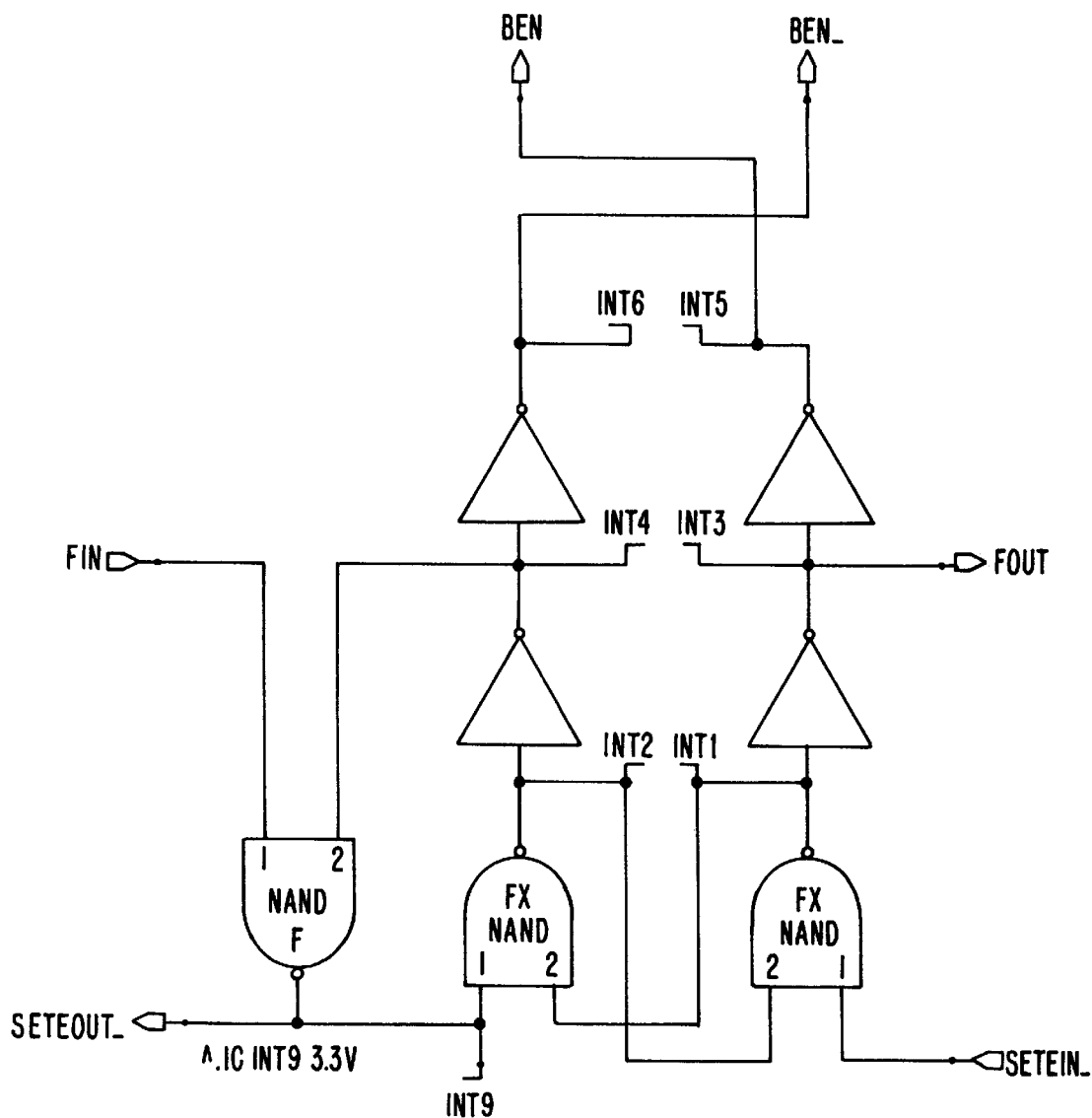
FIG. 4d is a schematic diagram of a static ASP FIFO control stage.

FIG. 4d is a schematic diagram of a second embodiment of the control circuit of the present invention. The stage shown in FIG. 4d is a static ASP FIFO control. The static ASP configuration differs from the pseudo-dynamic ASP circuit in several ways. In contrast with one-phase clock output of the pseudo-dynamic ASP circuit of the first embodiment, the static ASP FIFO control can be used to generate a two-phase clock signal. Further, in the static ASP configuration, voltages have the same meaning in every stage. For example, nodes labelled "Ben" and "Ben–" in FIG. 4d both operate latches in the FIFO circuit.

Figure 4E:
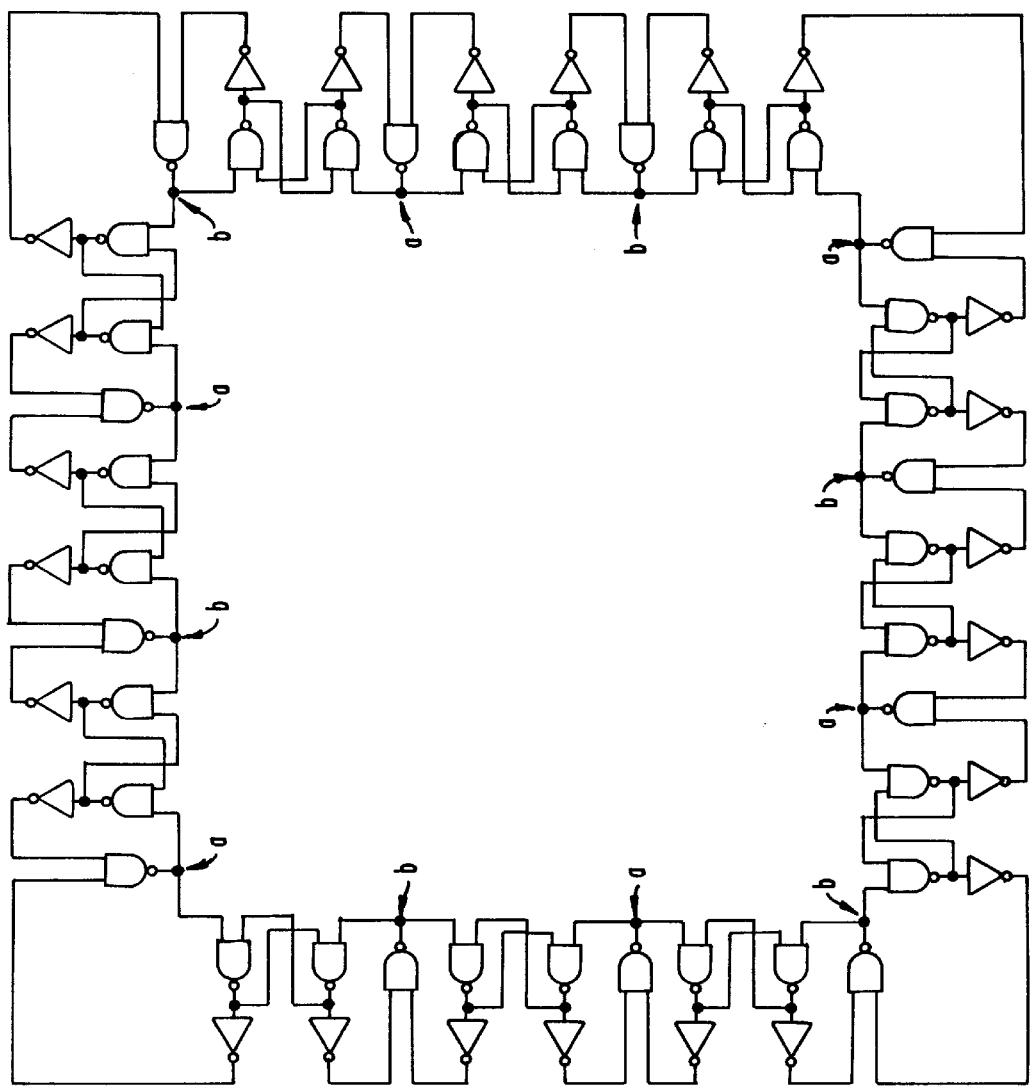
FIG. 4e is a schematic diagram of a ring of static ASP FIFO control circuits.

FIG. 4e is a schematic diagram of a FIFO control ring using static ASP control stages, each as shown in FIG. 4d. The FIFO control ring 490 is initialized half full by setting the nodes labelled "a" to low and the nodes labelled "b" to high. All of the nodes labelled "a" will be in phase with each other and 180 degrees out of phase from the nodes labelled "b."

Figure 5A:
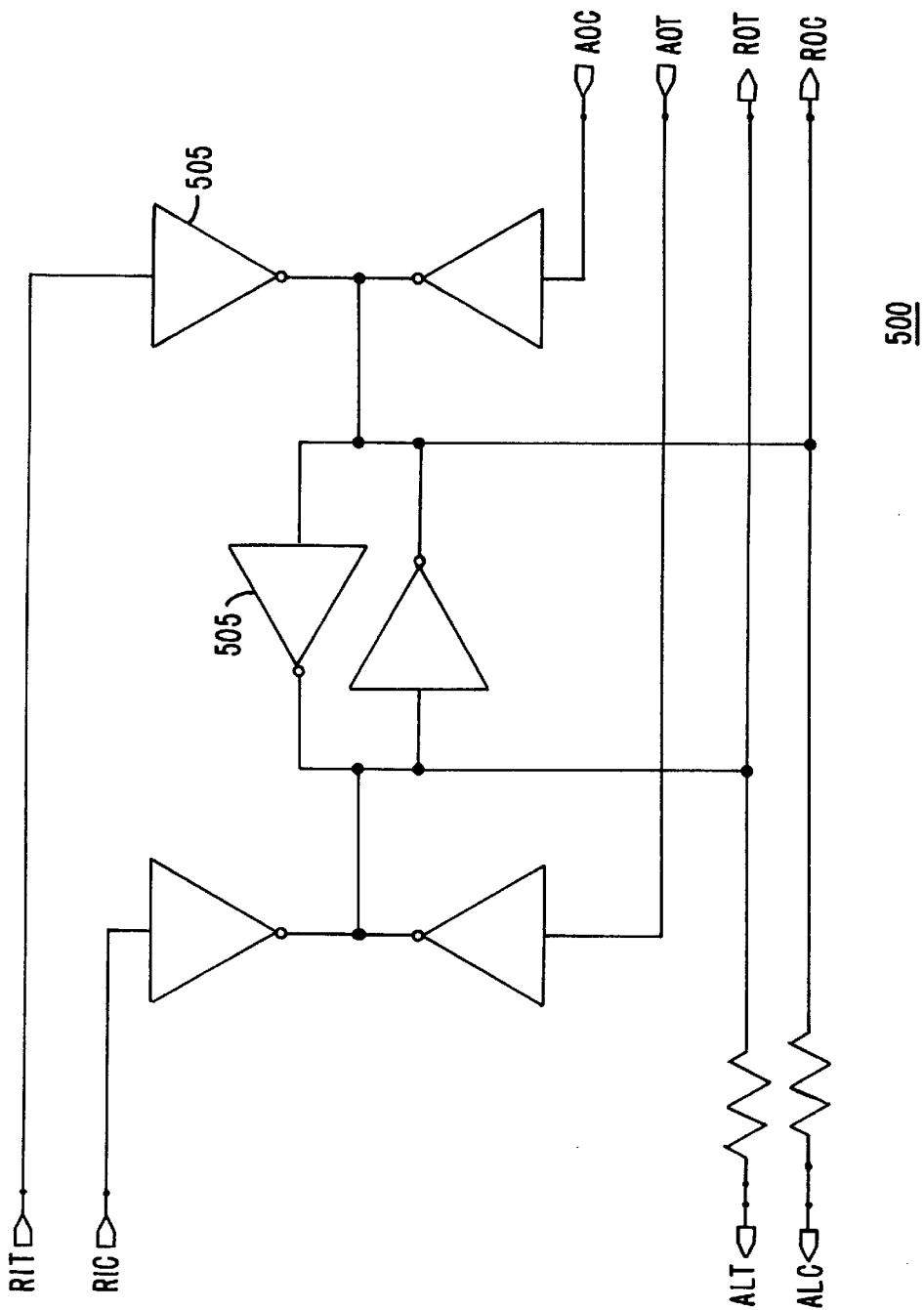
FIG. 5a is a schematic diagram of one embodiment of a micropipeline FIFO control stage.

In a third embodiment of the present invention, the control stages can be made of micropipeline control structures. FIG. 5a is a schematic diagram of one alternative of a micropipeline FIFO control stage according to that third embodiment of the present invention. Micropipeline control circuit 700 is event-controlled, meaning that the circuit oscillates without processing and instead relies on transition events in adjacent circuits. A transition event occurs when a present value signal in a stage either rises or falls. Each internal stage of the micropipeline circuit captures a new data value whenever its successor stage has accepted the present value, and its predecessor stage has the new data ready. Each stage operates at its own pace, using control information only from immediately adjacent stages. Thus, the absolute state of a transition signal does not matter. Instead, for each stage what matters is its state relative to other adjacent stages' states.

The term micropipeline applies to any circuitry suitable for laying in microelectronic form. As used in the present invention, micropipelines are relatively simple circuits that input and output data at variably high rates with or without internal processing. Because of their simple design, they are well-suited in cost and simplicity for complex VLSI systems.

The FIFO circuit 500 shown in FIG. 5a illustrates the micropipeline concept with a circuit of capture and pass switches 505. Switches 505 may represent any electronic circuitry suitable for forming a switch, such as a series of transistors. If the state of circuit 500 differs from both the state of its predecessor circuit by inputs Rit or Ric, and its successor circuit by acknowledgment paths Aoc and Aot, then circuit 500 will copy the input state from Rit and Ric. If the state of circuit 500 does not differ from both pairs of predecessor input and successor acknowledgement paths, the present state is held and output on lines Rot and Roc, respectively. As the circuit 500 transitions, the event is passed back to the preceding stage through acknowledgement paths Alt and Alc. FIFO circuit 500, with two inputs and two outputs, is an example of a double rail implementation with true and complement signals having a 180 degrees phase relationship.

Figure 5B:
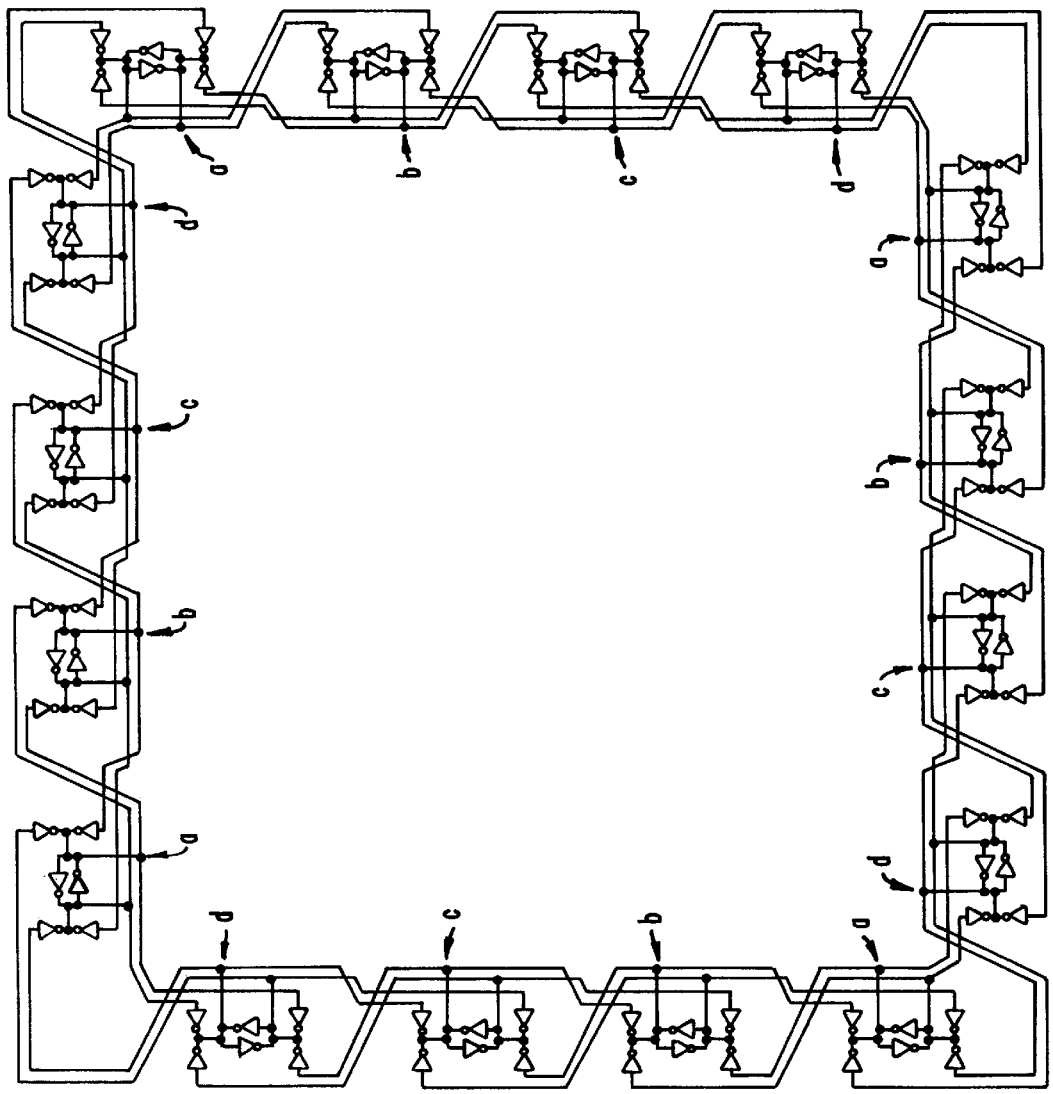

FIG. 5b is a schematic diagram of an asynchronous FIFO control ring composed of multiple stages of the first alternative micropipeline control structure shown in FIG. 5a. FIFO control ring 510 is also a double rail implementation, with true and complement control signals. Control ring 510 will oscillate by transitioning an initial signal through successive stages. For example, control ring 510 is initialized half full when the nodes labelled "a" and "b" are initialized low and the nodes labelled "c" and "d" are initialized high. In this case every second stage is empty and ready to transition from a low to a high state or a high to a low state. There is a 90 degrees phase shift between adjacent stages, and therefore all nodes having the same label output a synchronized signal with the same phase.

Figure 6A:
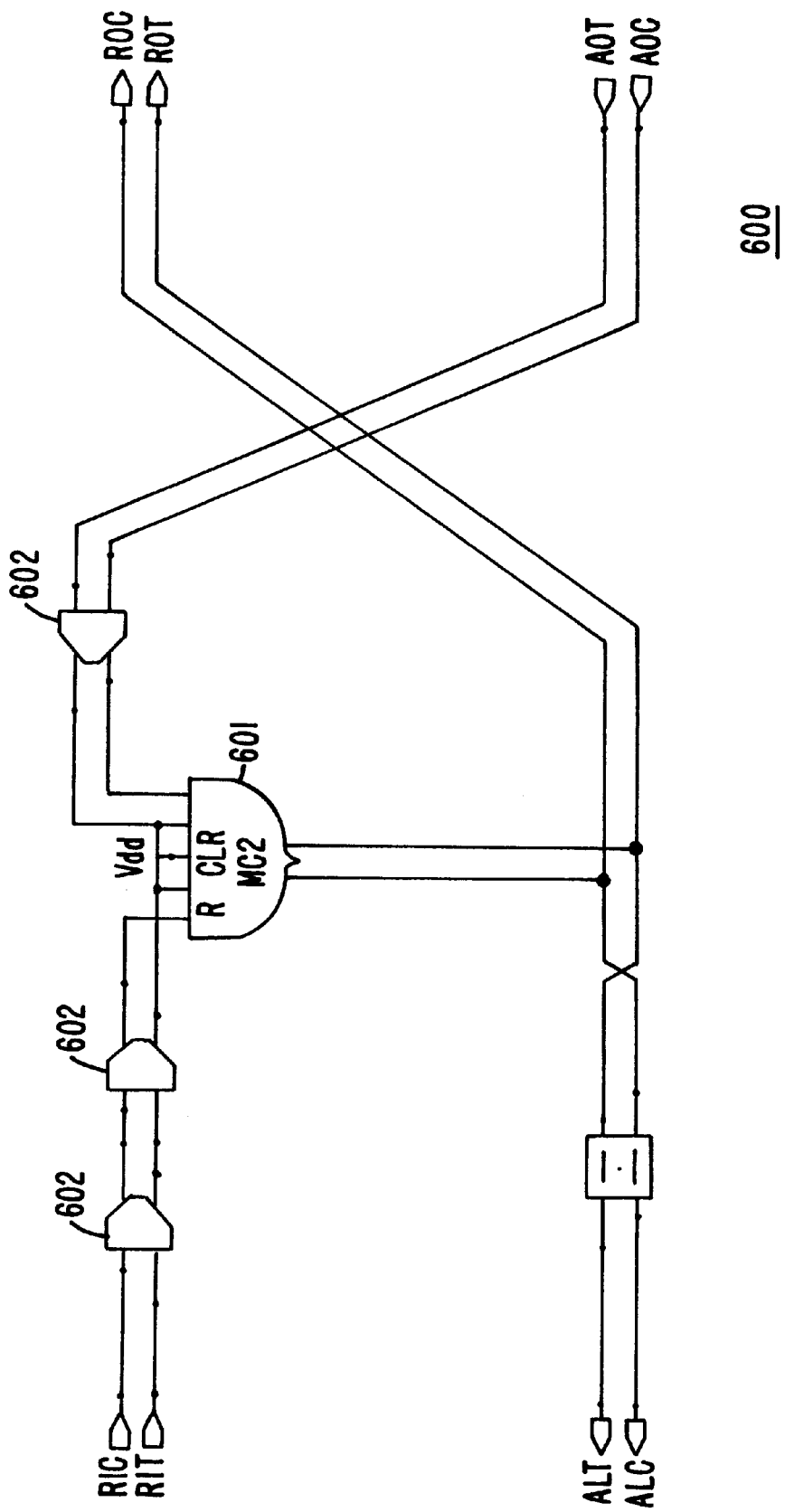
FIG. 6a is a schematic diagram of a second embodiment of a micropipeline FIFO control stage.

FIG. 6a is a schematic diagram of another alternative embodiment of micropipeline control stage according to the present invention. The micropipeline circuit shown in FIG. 6a is also a double-rail implementation. As with the previous circuit in FIG. 5a, micropipeline circuits may also be implemented as single-rail. Element 601 functionally represents an AND gate. In the preferred embodiment of a double-rail implementation, element 601 is a Muller-C circuit having two pairs of inputs. A Muller-C circuit may be implemented with transistors. However, any circuitry producing AND functions may be used.

The circuit in FIG. 6a functions much like the circuit in FIG. 5a described above. Element 601 receives an input both from a previous stage on input paths Ric and Rit, and from the next stage on acknowledgement paths Aot and Aoc. Delay elements 602 may be added to more complex circuits to control the rate of transition signalling. When the state of circuit 600, as output on lines Roc and Rot, differs from the states of both pairs of paths Ric and Rit, and Aot and Aoc, element 601 will transition to copy the state of Ric and Rit. That state in turn is output on paths Roc and Rot, respectively. When the state on paths Roc and Rot does not differ from the pairs of inputs to element 601, no transition will occur.

Figure 6B:
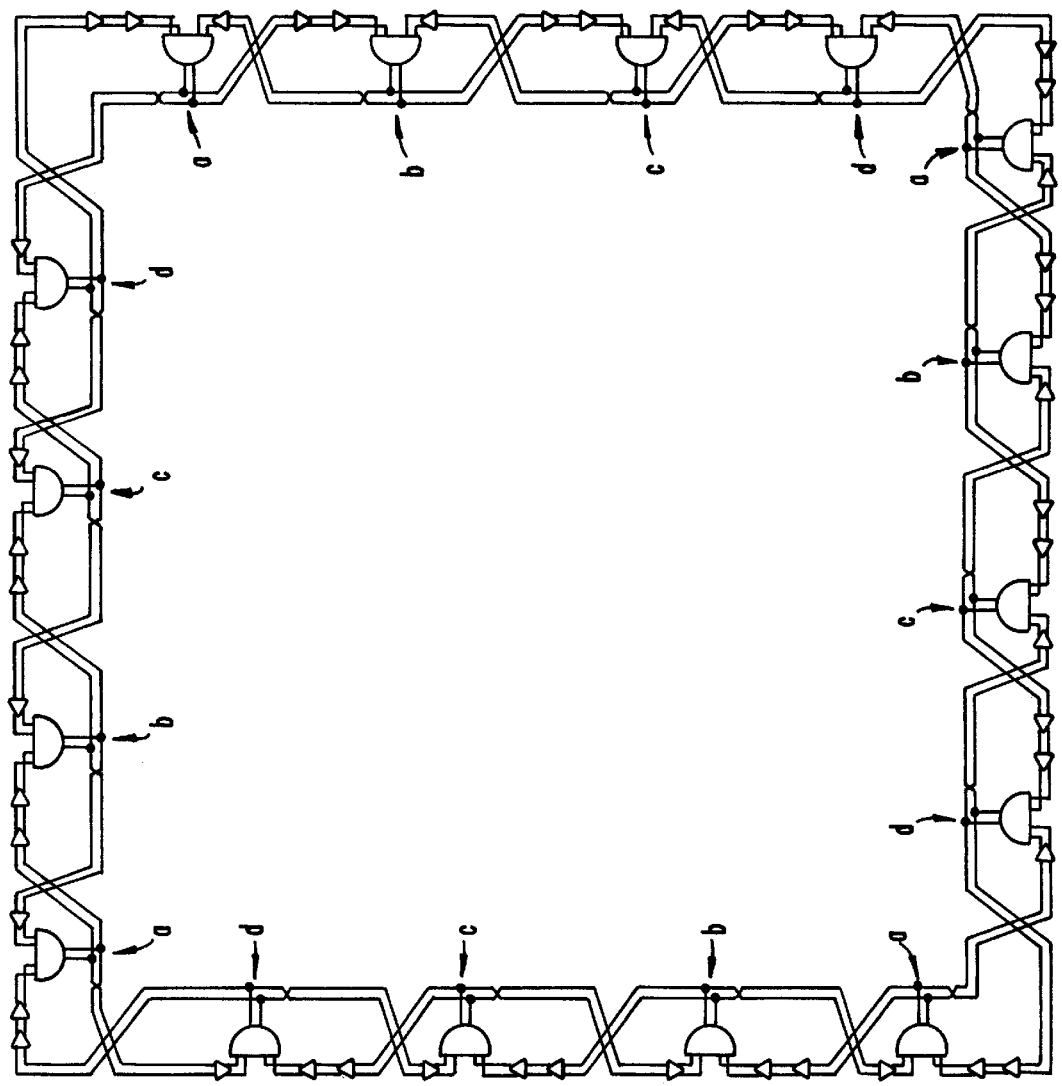

FIG. 6*b* is a schematic diagram of an asynchronous FIFO control ring composed of multiple, replicated stages of the second micropipeline FIFO alternative. The FIFO control ring 610 is initialized half-full when the nodes labelled "a" and "b" are initialized low and the nodes labelled "c" and "d" are initialized high. There is a 90 degree phase shift between adjacent stages. All nodes with the same label are in-phase with each other.

The above description explains how to make and use several preferred embodiments of a system for generating and distributing precisely synchronized clock signals on a chip according to the present invention. While the above is a complete description of the preferred embodiments of the invention, various alternatives, modifications, and equivalents may be used. For example, other FIFO circuits may be used in the control stages of the FIFO ring. Further, the number of stages comprising a ring may vary depending on the desired number of clock output nodes or size of the chip. Therefore, the above description should not be taken as limiting the scope of the invention which is defined by the appended claims.

What is claimed is:

1. A system for distributing clock signals to a plurality of locations on a chip such that each of the plurality of locations receives a local clock signal which is substantially synchronized with local clock signals received at other locations, the system comprising:
    (a) a ring of control structures, one per location, wherein each control structure in the ring is associated with a previous control structure in the ring and a next control structure in the ring, each control structure comprising:
        (1) an input;
        (2) an output; and
        (3) a clock distribution node at which the control structure outputs its local clock signal; and
    (b) a plurality of signal lines, wherein a signal line carries a signal from the output of one control structure to the input of the one control structure's next control structure, the signal line and the control structure having a combined signal delay substantially equal to a combined signal delay of each of the control structures and their output signal lines.

2. The system of claim 1, wherein each control structure exhibits a similar delay as other control structures in the ring and wherein each signal line is substantially identical in length as the other signal lines.

3. The system of claim 1, wherein each local clock signal is aligned in phase with the other local clock signals.

4. The system of claim 1, wherein said control structures are FIFO circuits.

5. The system of claim 1, wherein said control structures are micropipeline circuits.

6. A system for distributing synchronous clock signals on a chip comprising:
    (a) an oscillating FIFO ring comprising a plurality of FIFO stages, each FIFO stage further comprising:
        (1) a memory for storing a signal;
        (2) a control circuit coupled to said memory for controlling signal transitions from said memory to a next memory in said ring according to a predetermined oscillation; and
        (3) a signal line coupling said memory to said next memory in said ring thereby delaying said transition; and
    (b) a plurality of clock distribution nodes each coupled to one of said FIFO stages, whereby each one of said clock distribution nodes outputs a clock signal when said transition occurs.

7. Circuitry for distributing clock signals on a chip including a plurality of stages, comprising:
    a first control circuit for controlling a transfer state of a first one of the plurality of stages;
    a second control circuit for controlling a transfer state of a second one of the plurality of stages, wherein the second control circuit is serially coupled to the first stage;
    a detection circuit connected to outputs of the first and second control circuits, for generating a move signal based on the outputs of the first and second control circuits;
    a node coupled to each stage for outputting a signal indicating that the stage has just moved data; and
    said plurality of stages being coupled to form a ring.

8. The circuitry of claim 7 wherein each stage is coupled by a signal line of substantially equal length.

9. A computer processor device, comprising:
    a computer chip having a plurality of electrical components, wherein at least a portion of said electrical components are synchronous processor circuits clocked by substantially identical clock signals;
    a plurality of FIFO circuits on the computer chip serially connected into a ring, each one of said FIFO circuits further comprising an input for accepting a data element, a memory for storing a data element, an output for outputting a data element, and at least one clock distribution node coupled to at least one of said plurality of electrical components, for outputting a signal when a data element passes through said FIFO circuit.

10. The device in claim 9 wherein the plurality of FIFO circuits are micropipeline circuits.

* * * * *